United States Patent [19]
Chiang et al.

[11] Patent Number: 5,915,178
[45] Date of Patent: Jun. 22, 1999

[54] METHOD FOR IMPROVING THE ENDURANCE OF SPLIT GATE FLASH EEPROM DEVICES VIA THE ADDITION OF A SHALLOW SOURCE SIDE IMPLANTED REGION

[75] Inventors: An-Min Chiang, Hsin-Chu; Long-Shang Juang, Tainan District; Chi-Shiang Lee; Jyh-Feng Lin, both of Hua-Lien, all of Taiwan

[73] Assignee: Taiwan Semiconductor Manufacturing Company, Ltd., Hsin-Chu, Taiwan

[21] Appl. No.: 08/986,531

[22] Filed: Dec. 8, 1997

[51] Int. Cl.⁶ ................................................ H01L 21/8247
[52] U.S. Cl. ........................................... 438/266; 438/286
[58] Field of Search .................................... 438/257–267, 438/286

[56] References Cited

U.S. PATENT DOCUMENTS

| | | |
|---|---|---|
| 5,130,769 | 7/1992 | Kuo et al. ............................. 357/23.5 |
| 5,313,421 | 5/1994 | Guterman et al. ...................... 365/185 |
| 5,340,760 | 8/1994 | Komori et al. . |
| 5,414,287 | 5/1995 | Hong ..................................... 257/316 |
| 5,573,965 | 11/1996 | Chen et al. . |
| 5,674,764 | 10/1997 | Liu et al. . |
| 5,766,997 | 6/1998 | Takeuchi ............................... 438/257 |
| 5,776,787 | 7/1998 | Keshtbod . |
| 5,776,811 | 7/1998 | Wang et al. ............................ 438/264 |
| 5,789,297 | 8/1998 | Wang et al. ............................ 438/267 |

*Primary Examiner*—Richard A. Booth
*Attorney, Agent, or Firm*—George O. Saile; Stephen B. Ackerman

[57] ABSTRACT

A process for fabricating a flash EEPROM device, incorporating a shallow, heavily doped, source side region, used to improve the endurance of the flash EEPROM device, has been developed. The process features placing a shallow, ion implanted arsenic region, in the semiconductor substrate, adjacent to one side of a floating gate structure, prior to creation of the control gate structure. The addition of the shallow, ion implanted arsenic region, improves the coupling ratio at the source, which in turn results in the ability of the flash EEPROM device to sustain about 1,000,000 program/erase cycles, compared to counterparts, fabricated without the shallow, source side region, only able to sustain about 400,000 program/erase cycles.

27 Claims, 5 Drawing Sheets

METHOD FOR IMPROVING THE ENDURANCE OF SPLIT GATE FLASH EEPROM DEVICES VIA THE ADDITION OF A SHALLOW SOURCE SIDE IMPLANTED REGION

BACKGROUND OF THE INVENTION (1) Field of the Invention

The present invention relates to processes used to fabricate semiconductor devices, and more specifically to a process used to improve the endurance of a flash Electrically Erasable Programmable Read Only Memory, (EEPROM), device.

(2) Description of the Prior Art

Electrical Erasable Programmable Read Only Memory devices store data in a non-volatile mode, and can be erased and rewritten as desired. The EEPROM device, unlike the EPROM, (Erasable Programmable read Only Memory), device, which needs exposure to radiation, can be erased electrically. One form of EEPROM devices, is comprised of a "split gate" electrode configuration, in which the control gate overlies a portion of an underlying floating gate, and overlies a portion of the channel region. One type of EEPROM device providing electrical erasing is a Flash EEPROM, in which the term flash refers to the ability to erase numerous memory cells simultaneously. The flash EEPROM is usually programmed by applying a voltage to the control gate, creating hot electron carrier injection, raising the threshold voltage of all transistors being programmed.

The endurance of the flash EEPROM device, or the amount of program/erase cycles the device can withstand, is related to the coupling ratio at the source. For example a low coupling ratio at the source side of the single cell device may only provide about 400,000 program/erase cycles, due to hot electrons being trapped in an inter-polysilicon oxide layer. This invention will describe a process in which a shallow and highly doped source side, in addition to the lighter doped, deep source region, is used to increase the coupling ratio at the source side, and thus increase the single cell endurance from about 400 K cycles, to about 1000 K cycles, and increase the product endurance for a flash EEPROM, from about 40,000 to 70,000 cycles. Prior art such as Kuo, et al, in U.S. Pat. No. 5,130,769, describe a split gate EEPROM device, featuring the creation of a diode in the drain region. However that invention differs from the shallow source side implantation procedure, presented in this invention, in which only one conductivity ions are used, not creating a diode.

SUMMARY OF THE INVENTION

It is an object of this invention to improve the endurance of flash EEPROM devices.

It is another object of this invention to create a high coupling ratio at the source side of the flash EEPROM device, to allow endurance improvements to be realized.

It is still another object of this invention to create a shallow, highly doped source region, in addition to the deep, lightly doped source region, to increase the coupling ratio at the source side.

In accordance with the present invention a method of creating a flash EEPROM device, incorporating a highly doped, shallow source side implanted region, used to improve the endurance of the EEPROM device, is described. A first gate oxide layer is grown on a semiconductor substrate followed by the deposition of a first polysilicon layer. The first polysilicon layer is patterned to create a floating gate structure, with an overlying silicon oxide layer. After the creation of a thermally grown silicon oxide layer, and a high temperature deposition of an additional silicon oxide layer, a silicon nitride layer is deposited and subjected to an anisotropic dry etching procedure, to create a nitride spacer, on the sides of the floating gate structure. A second gate oxide layer, used as low voltage oxide and used for part of the tunnel oxide of the EEPROM device, is grown on regions of the semiconductor substrate, not covered by the floating gate structure. A second polysilicon layer, and an overlying metal silicide layer are next deposited, and patterned to create the control gate structure, of the EEPROM device, partially overlying the floating gate structure, and partially overlying the control gate oxide. Photolithographic patterning is used to allow a deep, highly doped, source side region to be implanted in a region adjacent to the floating gate structure. This is followed by an additional ion implantation procedure, creating the shallow, highly doped, source side region, again adjacent to the floating gate structure, used for the endurance improvement of the flash EEPROM device. After of lightly doped source and drain regions, and the formation of insulator spacer, on the exposed sides of the control gate structure, a highly doped source and drain region is formed via ion implantation procedures.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of fabricating a flash EEPROM device, incorporating a shallow, heavily doped, source side region, to improve the endurance of the flash EEPROM device, will now be described in detail. This invention can be used for flash EEPROM devices now being manufactured in industry, therefore only the specific areas, unique to this invention, will be detailed. This invention will be described using an N channel type, MOSFET device. However this invention can also be accomplished for a P channel type, MOSFET device, via use of an N well region, P type source and drain regions, and a shallow, highly P type doped, source side region.

Figure 1:
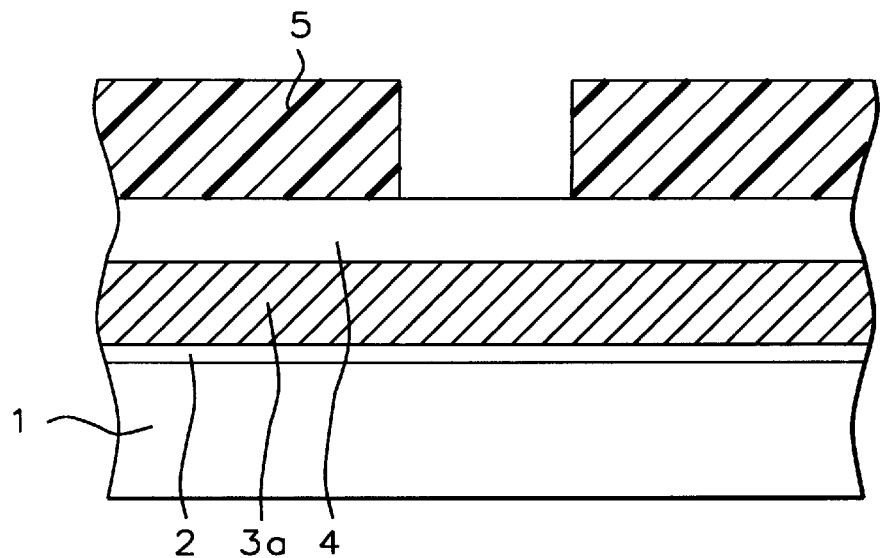
FIGS. 1–10, which schematically, in cross-sectional style, show the key stages of fabrication used to create the flash EEPROM device, with the shallow, highly doped, source side region.

A P type, semiconductor substrate 1, comprised of single crystalline silicon with a <100> crystallographic orientation, is used and schematically shown in FIG. 1. A first gate insulator layer 2, of silicon dioxide, is thermally grown in an oxygen—steam ambient, at a temperature between about 825 to 875° C., to a thickness between about 75 to 125 Angstroms. A first polysilicon layer 3a, is next deposited via low pressure chemical vapor deposition, (LPCVD), procedures, to a thickness between about 1250 to 1750 Angstroms. A silicon nitride layer 4, is than deposited on first polysilicon layer 3a, using either LPCVD or plasma enhanced chemical vapor deposition, (PECVD), procedures, to a thickness between about 1250 to 1750 Angstroms. A photoresist shape 5, presenting an opening that will subsequently result in the shape of a floating gate structure, is formed on silicon nitride layer 4. This is schematically shown in FIG. 1.

Figure 2:
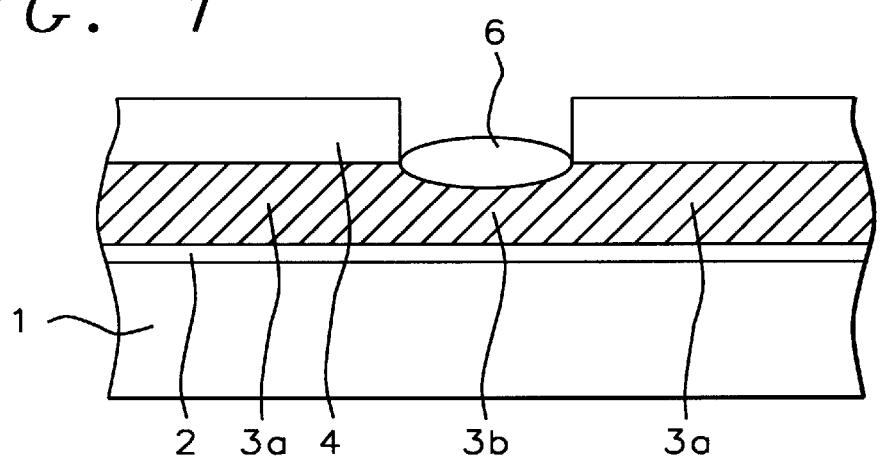

A reactive ion etching, (RIE), procedure is next employed to remove silicon nitride layer 4, in regions exposed in the opening in photoresist shape 5, exposing the top surface of first polysilicon layer 3a. A boron ion implantation procedure, at an energy between about 80 to 120 KeV, at a dose between about 1E12 to 7E12 atoms/cm$^2$, is used to dope the semiconductor substrate 1, in regions where silicon nitride has been removed, altering the dopant concentration in the channel region, under a subsequent floating gate structure. This doped channel region is not shown in FIG. 2. Prior to the doping of the channel region, regions of polysilicon layer not protected by photoresist shape 5, are ion implanted with phosphorous, at an energy between about 20 to 40 KeV, at a dose between about 2.6 to 3.0 atoms/cm$^2$. After removal of photoresist shape 5, via plasma oxygen ashing and careful wet cleans, the region of exposed first polysilicon layer 3a, is subjected to an oxygen—steam ambient, at a temperature between about 875 to 925° C., forming poly oxide layer 6, at a thickness between about 1500 to 1900 Angstroms. The formation of poly oxide layer 6, consumed between about 700 to 900 Angstroms of the top portion of first polysilicon layer 3a, resulting in the bottom portion of polysilicon layer 3b, now between about 600 to 800 Angstroms in thickness, underlying poly oxide layer 6. First polysilicon layer 3a, protected by silicon nitride layer 4, remains unoxidized. This is schematically illustrated in FIG. 2.

Figure 3:
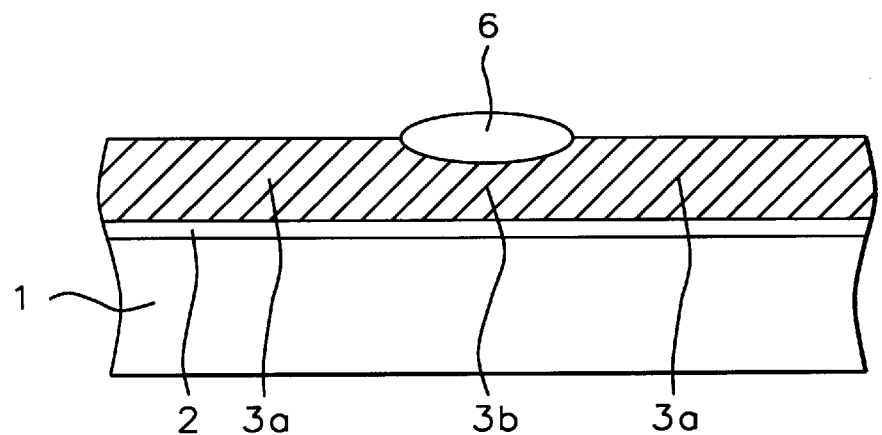
Figure 4:
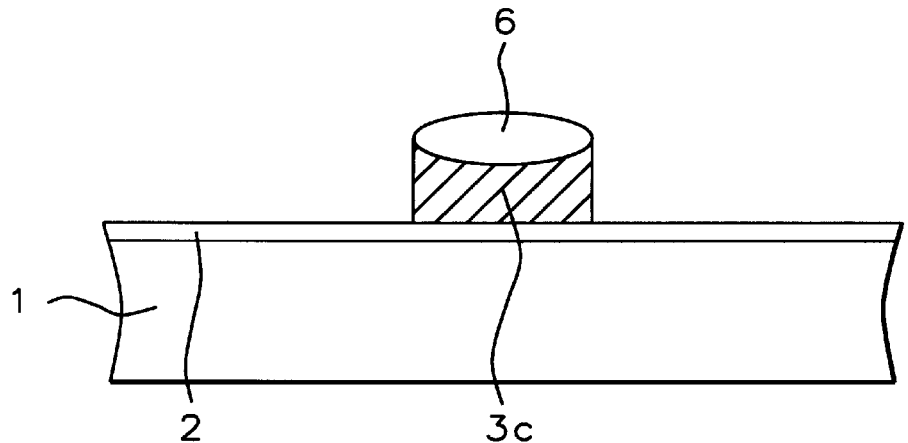

A buffered hydrofluoric acid solution, is used to remove any oxide formed on the surface of silicon nitride layer 4, during the poly oxide formation step, followed by the selective stripping of silicon nitride layer 4, from the top surface of first polysilicon layer 3a, via use of a hot phosphoric acid solution, resulting in the structure schematically shown in FIG. 3. A selective RIE procedure, using $Cl_2$ as an etchant, and using poly oxide 6, as a mask, is used to remove unwanted regions of first polysilicon layer 3a, resulting in the formation of floating gate structure 3c, on first gate insulator layer 2, and underlying poly oxide layer 6. This selective RIE procedure results in minimal removal of first gate oxide layer 2, which is now about 90 Angstroms, in regions not covered by floating gate structure 3c. This is schematically shown in FIG. 4.

Figure 5:
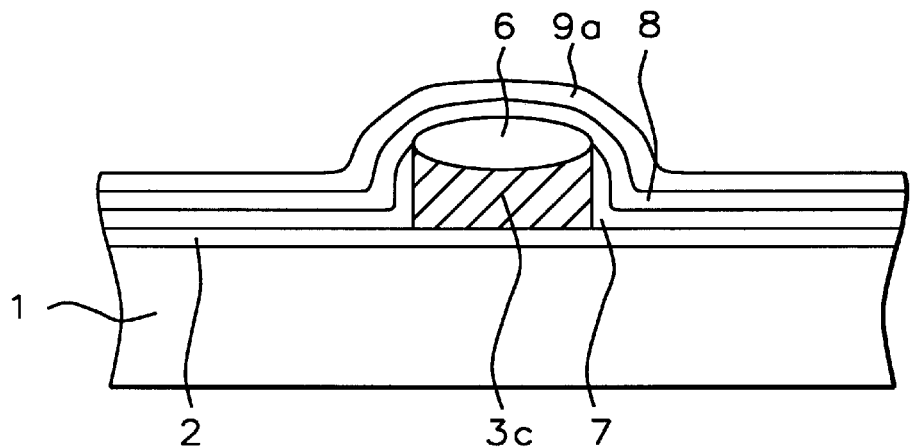
Figure 6:
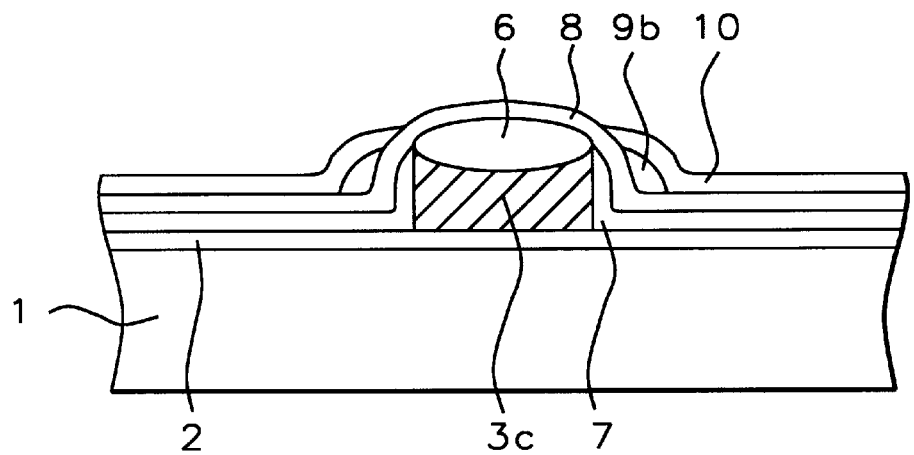

The formation of the tunneling insulators are next addressed. First a silicon oxide layer 7, is formed on the sides of floating gate structure 3c, and on first gate oxide layer 2, via a steam oxidation procedure, performed at a temperature between about 825 to 875° C., to a thickness between about 100 to 110 Angstroms. This is schematically shown in FIG. 5. Next a high temperature oxide, (HTO), silicon oxide layer 8, is deposited at a temperature between about 775 to 825° C., to a thickness between about 90 to 110 Angstroms, followed by the deposition of silicon nitride layer 9a, deposited using LPCVD or plasma enhanced chemical vapor deposition, (PECVD), procedures, to a thickness between about 160 to 200 Angstroms. This is again schematically shown in FIG. 5. A selective, anisotropic RIE procedure is next performed, using $SF_6$ as an etchant, creating silicon nitride spacers 9b. This selective RIE procedure does not remove HTO, silicon oxide layer 8, during the spacer formation. Finally another silicon oxide layer 10, is thermally grown, in a steam ambient, in regions in which underlying semiconductor substrate 1, or silicon nitride spacers 9b, can be oxidized, to a thickness between about 110 to 120 Angstroms. This is schematically shown in FIG. 6.

Figure 7:
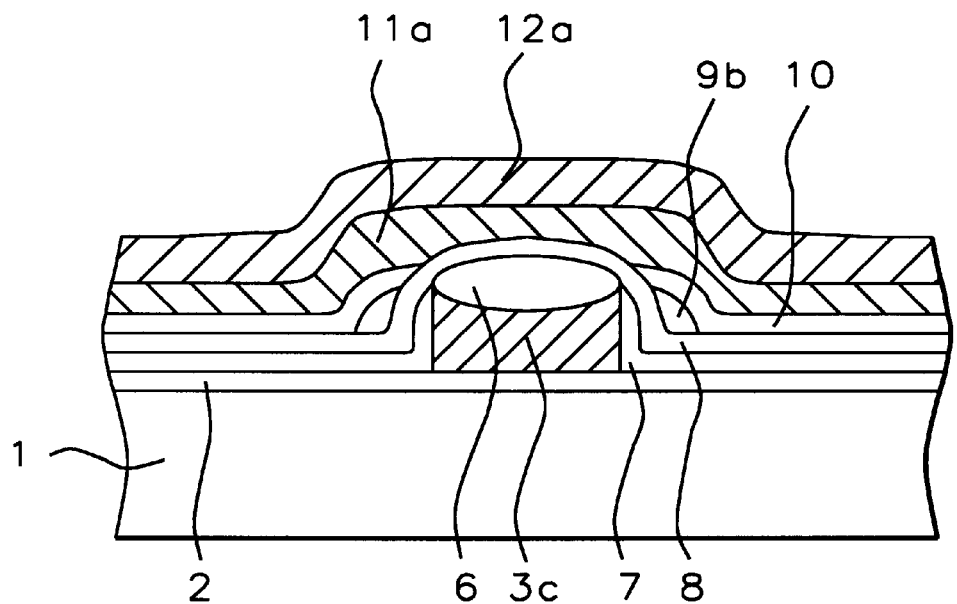
Figure 8:
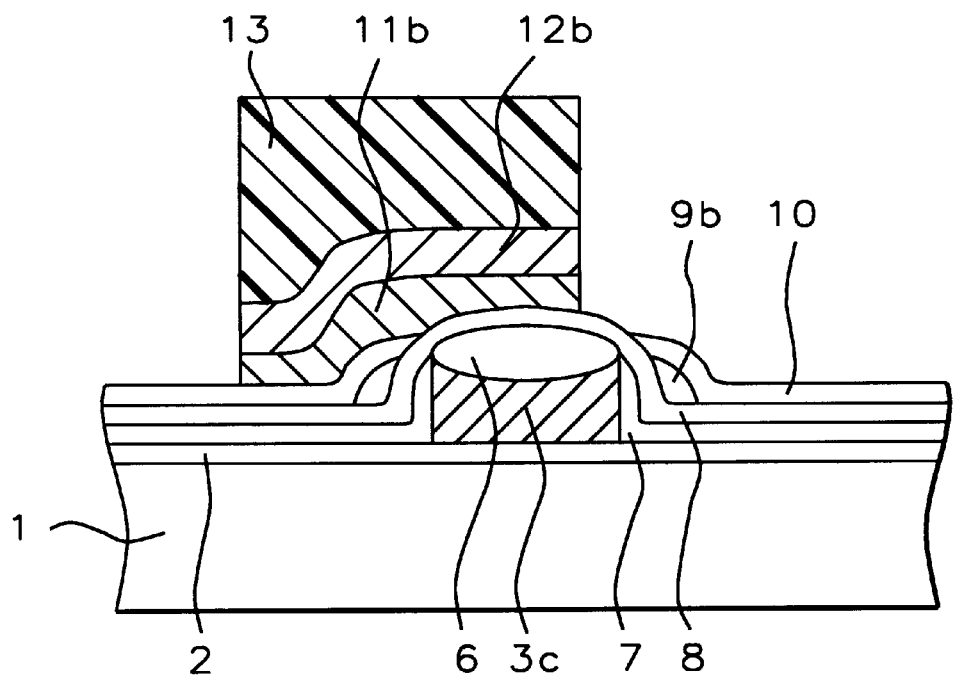

A second polysilicon layer 11a, is deposited using LPCVD procedures, to a thickness between about 1250 to 1750 Angstroms. Second polysilicon layer 10a can be deposited using in situ doping procedures, or second polysilicon layer 11a can be deposited intrinsically and doped via ion implantation, or $POCl_3$ procedures, to result in a polysilicon layer exhibiting a sheet resistance between about 40 to 46 ohms/square. After a pre-clean procedure, a deposition of tungsten silicide layer 12a, is performed using LPCVD procedures, to a thickness between about 1000 to 1500 Angstroms, using silane and tungsten hexafluoride as a source. This is schematically shown in FIG. 7. A photoresist shape 13, is next formed on tungsten silicide layer 12a, followed by an anisotropic RIE procedure, using $Cl_2$ as an etchant for tungsten silicide layer 12a, and second polysilicon layer 11a, creating the control gate structure, comprised of tungsten silicide shape 12b, and polysilicon shape 11b. The control gate structure partially overlays silicon oxide insulated, floating gate 3c, and partially overlays the stack of insulator layers, (silicon oxide layer 10, HTO silicon oxide layer 8, silicon oxide layer 7, and first gate oxide layer 2). In addition the control gate structure is also isolated from floating gate structure 3c, via the silicon nitride spacer 9b, on the sidewall of floating gate structure 3c. This is schematically shown in FIG. 8.

Figure 9:
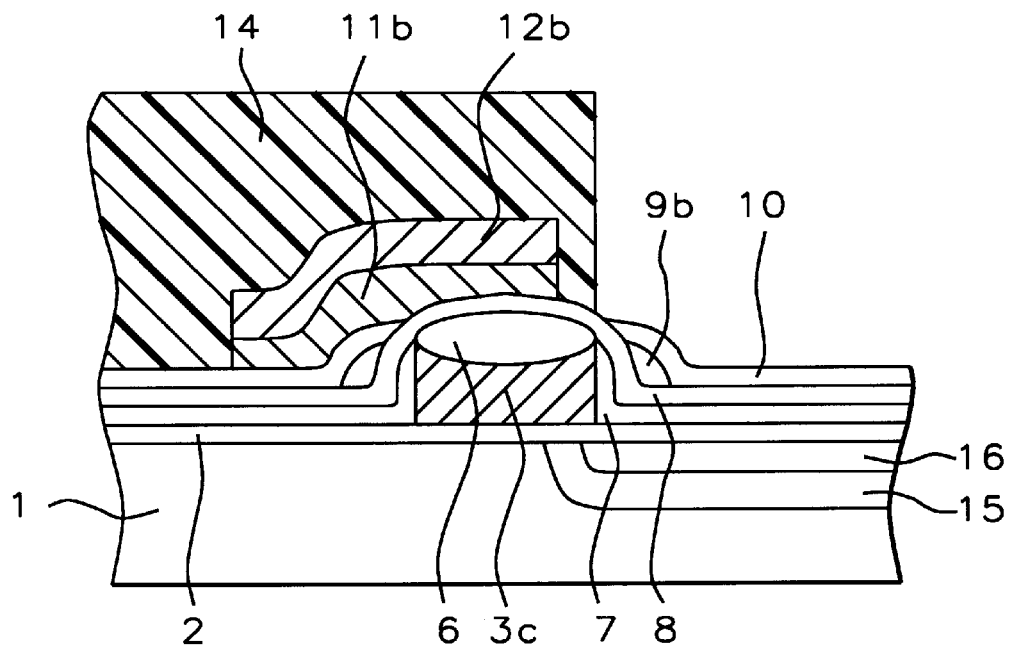

After removal of photoresist shape 13, via plasma oxygen ashing and careful wet cleans, photoresist shape 14 is formed, to be used for an ion implantation mask. First a deep, highly doped, source side region 15, is formed via ion implantation of phosphorous, at an energy between about 50 to 70 KeV, at a dose between about 4E15 to 6E15 atoms/cm$^2$. Next the critical shallow, highly doped, source side region 16, is formed, via ion implantation of arsenic, at an energy between about 80 to 120 KeV, at a dose between about 4E15 to 6E15 atoms/cm$^2$. This is schematically shown in FIG. 9. After removal of photoresist shape 14, again via the use of plasma oxygen ashing and careful wet cleans, a drive-in procedure is performed at a temperature between about 900 to 940° C. The depth of shallow, highly doped, source side region 16, in semiconductor substrate 1, is between about 0.30 to 0.50 uM, while deep, highly doped, source side region 15, is between about 0.70 to 1.0 uM, in semiconductor substrate 1. Shallow, highly doped, source side region 16, provides the endurance enhancement for the flash EEPROM device. The formation of an additional photoresist shape, used to block out the source side section, is followed by another ion implantation procedure, using phosphorous, at an energy between about 50 to 70 KeV, at a dose between about 3E13 to 5E13, is used to create lightly doped source and drain regions 17, shown schematically in FIG. 10.

Figure 10:
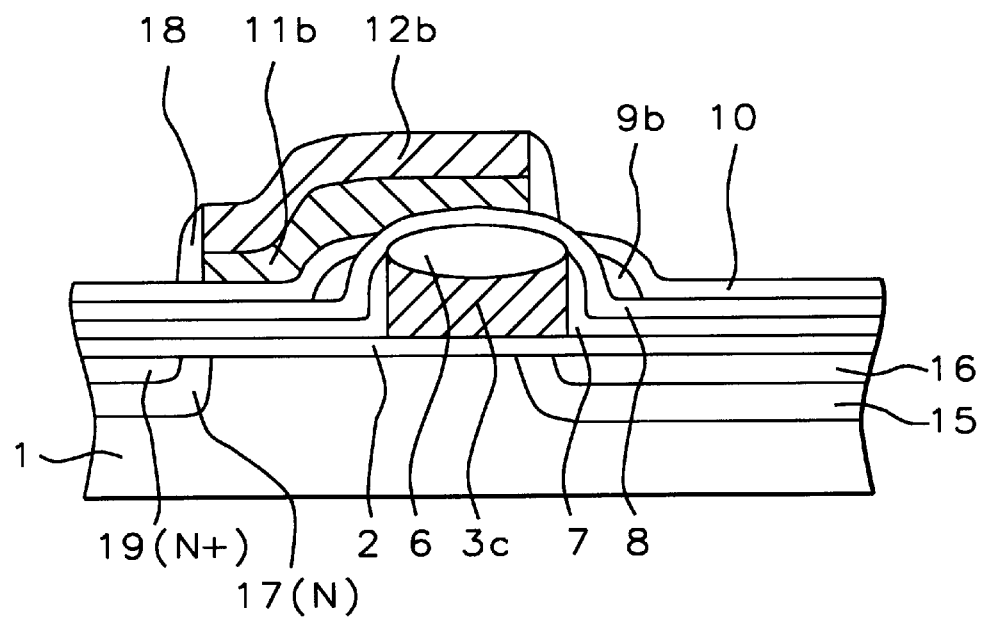

After photoresist removal and careful wet cleans, an insulator layer of silicon oxide, is deposited using LPCVD or PECVD procedures, to a thickness between about 1500 to 2500 Angstroms, followed by an anisotropic RIE procedure, using $CHF_3$ as an etchant, creating insulator spacers 187, on the sides of the control gate structure, schematically shown in FIG. 10. Finally another photolithographic procedure is used to allow heavily doped source and drain region 19, to be formed again only in the non-source side region of semiconductor substrate 1, via ion implantation of arsenic, at an energy between about 40 to 60 KeV, at a dose between about 2E15 to 4E15 atoms/cm$^2$. The masking photoresist shape is once again removed using plasma oxygen ashing and careful wet cleans.

Figure 11:
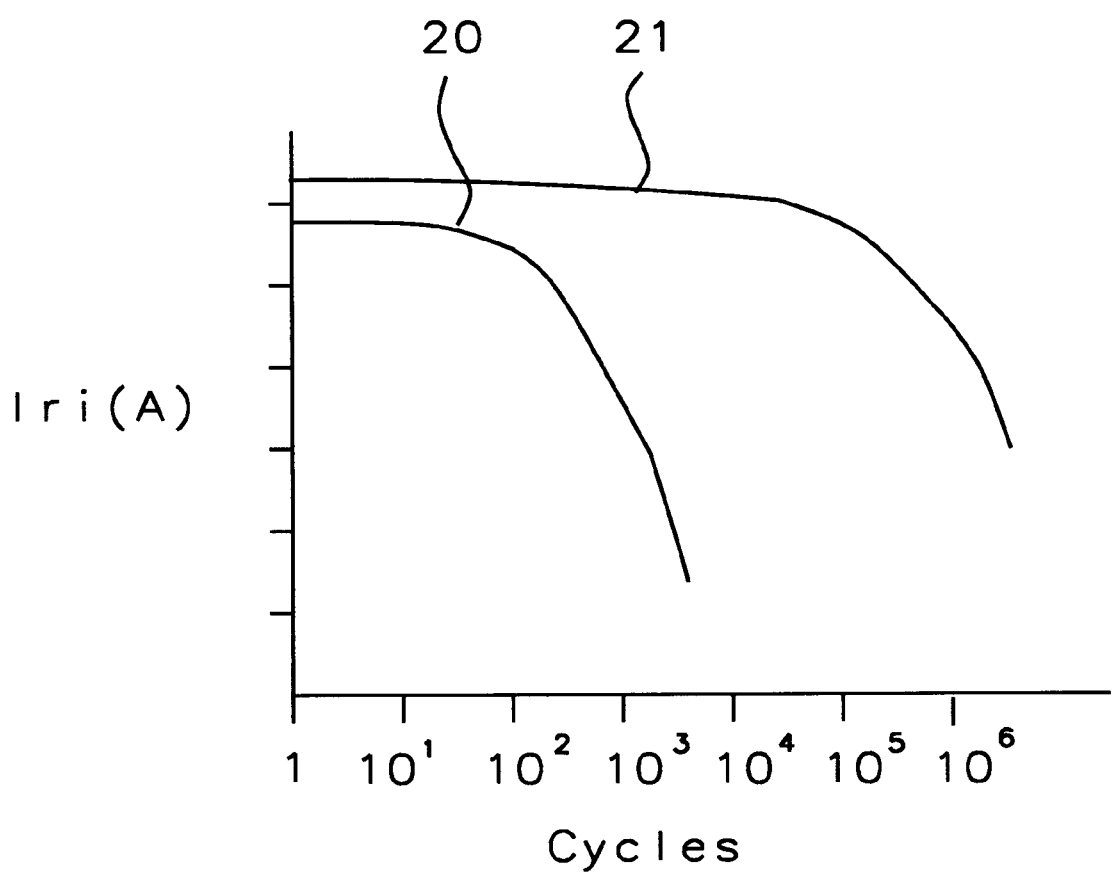
FIG. 11, which graphically illustrates the endurance improvement of a flash EEPROM device, fabricated using the shallow, highly doped, source side region, compared to a counterpart fabricated without the shallow, highly doped, source side region.

The benefit of employing the shallow, highly doped, source side region, is graphically shown in FIG. 11, where Iri, (cell current), is a measured as a function of the number of program/erase cycles. Flash EEPROM device 20, fabricated without the shallow, highly doped, source side region, withstands only about 400,000 cycles, before Iri decays, while flash EEPROM device 21, incorporating the shallow, highly doped, source side region, described in this invention, is able to withstand about 1,000,000 cycles.

While this invention has been particularly shown and described with reference to, the preferred embodiments thereof, it will be understood by those skilled in the art that various changes in form and detail may be made without departing from the spirit and scope of this invention.

What is claimed is:

1. A method of fabricating a flash EEPROM device, on a semiconductor substrate, comprising the steps of:

growing a first gate insulator layer on said semiconductor substrate;

forming a floating gate structure having sides, with an overlying poly oxide layer, on said semiconductor substrate;

growing a second gate insulator layer on a region of said first gate insulator layer, not covered by said floating gate structure;

depositing a high temperature oxide, (HTO) layer over said second gate insulator layer;

forming silicon nitride spacers on said sides of said floating gate structure;

growing a silicon oxide layer over regions of said semiconductor substrate, not covered by said floating gate structure;

forming a control gate structure, partially overlying said floating gate structure, and partially overlying said silicon oxide layer, in a first region;

forming only a deep, highly doped, source side region, in said semiconductor substrate, in a second region, adjacent to said floating gate structure;

forming only a shallow, highly doped, source side region, in said semiconductor substrate, in said second region, adjacent to said floating gate structure;

forming only a lightly doped drain region, in said semiconductor substrate, in a third region;

forming silicon oxide spacers on the sides of said control gate structure; and forming only a heavily doped drain region, in said semiconductor substrate, in said third region.

2. The method of claim 1, wherein said first gate insulator layer is silicon dioxide, thermally grown in a steam ambient, at a temperature between about 825 to 875° C., to a thickness between about 75 to 125 Angstroms.

3. The method of claim 1, wherein said poly oxide layer is formed by thermal oxidation of a first polysilicon layer, to a thickness between about 1500 to 1900 Angstroms, in regions not covered by a silicon nitride layer.

4. The method of claim 1, wherein said floating gate structure is formed from a first polysilicon layer, initially deposited using LPCVD procedures, to a thickness between about 1250 to 1750 Angstroms, and patterned using anisotropic RIE procedures, using $Cl_2$ as an etchant, and using said overlying poly oxide layer as a mask.

5. The method of claim 1, wherein said second gate insulator layer is silicon oxide, thermally grown in a steam ambient, at a temperature between about 825 to 875° C., to a thickness between about 100 to 110 Angstroms.

6. The method of claim 1, wherein said silicon nitride spacers are formed via LPCVD or PECVD deposition of silicon nitride, at a thickness between about 160 to 200 Angstroms, followed by an anisotropic RIE procedure, using $SF_6$ as an etchant.

7. The method of claim 1, wherein said control gate structure is comprised of an overlying tungsten silicide layer, deposited using LPCVD procedures to a thickness between about 1000 to 1500 Angstroms, and an underlying second polysilicon layer, deposited using LPCVD procedures to a thickness between 1250 to 1750 Angstroms.

8. The method of claim 1, wherein the second polysilicon layer has a sheet resistance between about 40 to 46 ohms/square, arrived at via use of either LPCVD situ doping procedures, or via applying a phosphorous ion implantation procedure, or a $POCl_3$ procedure, to an intrinsic polysilicon layer.

9. The method of claim 1, wherein said control gate structure is patterned via an anisotropic RIE procedure, using $Cl_2$ as an etchant for both the tungsten silicide layer and the second polysilicon layer.

10. The method of claim 1, wherein said deep, highly doped, source side region, is formed via ion implantation of phosphorous, at an energy between about 50 to 70 KeV, at a dose between about 4E15 to 6E15 atoms/cm$^2$.

11. The method of claim 1, wherein said shallow, highly doped, source side region, is formed via ion implantation of arsenic, at an energy between about 80 to 120 KeV, at a dose between about 4E15 to 6E15 atoms/cm$^2$.

12. The method of claim 1, wherein said silicon oxide spacers are formed at a thickness between 1500 to 2500 Angstroms.

13. A method of fabricating a flash EEPROM device, on a semiconductor substrate, incorporating a shallow, highly doped, source side region, comprising the steps of:

growing a first silicon dioxide gate layer on said semiconductor substrate;

growing a first polysilicon layer on said first silicon dioxide gate layer;

depositing a first silicon nitride layer on said first polysilicon layer;

forming an opening in said first silicon nitride layer, exposing the top surface of a region of said first polysilicon layer;

oxidizing a top portion of said first polysilicon layer, exposed in said opening, in said first silicon nitride layer, forming a poly oxide layer on a top portion of said first polysilicon layer;

removing said first silicon nitride layer from the top surface of said first polysilicon layer;

anisotropic etching of said first polysilicon layer, not covered by said poly oxide layer, to form a floating gate structure having sides, on said first silicon dioxide gate layer, comprised of a bottom portion of said first polysilicon layer, underlying said poly oxide layer;

growing a second silicon oxide gate layer, in regions of said semiconductor substrate not covered by said floating gate structure;

depositing a high temperature oxide, (HTO), layer over said second silicon oxide gate layer;

depositing a second silicon nitride layer;

anisotropic etching of said second silicon nitride layer, to form silicon nitride spacers on the sides of said floating gate structure;

growing a third silicon dioxide layer, on regions of said semiconductor substrate, not covered by said floating gate structure;

depositing a second polysilicon layer;

depositing a metal silicide layer on said second polysilicon layer;

anisotropic etching of said metal silicide layer, and of said second polysilicon layer, to form a control gate structure, with said control gate structure partially overlying said third silicon oxide layer, in a first region;

ion implanting a first conductivity imparting dopant, into said semiconductor substrate, in a second region, adjacent to said floating gate structure, to form only a deep, highly doped, source side region;

ion implanting a second conductivity imparting dopant, into said semiconductor substrate, in said second region, adjacent to said floating gate structure, to form only said shallow, highly doped, source side region;

ion implanting a third conductivity imparting dopant, in a third region of said semiconductor substrate, to form only a lightly doped drain region;

depositing an insulator layer;

anisotropic etching of said insulator layer, to form insulator spacers on the sides of said control gate structure; and ion implanting a fourth conductivity imparting dopant into said third region of said semiconductor substrate, to form only a heavily doped drain region.

14. The method of claim 13, wherein said first silicon dioxide gate layer is thermally grown, in an oxygen—steam ambient, at a temperature between about 825 to 875° C., to a thickness between about 75 to 125 Angstroms.

15. The method of claim 13, wherein said first polysilicon layer is deposited using LPCVD procedures, to a thickness between about 1250 to 1750 Angstroms.

16. The method of claim 13, wherein said poly oxide layer is thermally grown from said top portion of said first polysilicon layer, to a thickness between about 1500 to 1900 Angstroms, leaving between about 600 to 800 Angstroms of said bottom portion, of said first polysilicon layer, unoxidized.

17. The method of claim 13, wherein said floating gate structure is formed via anisotropic RIE of said first polysilicon layer, using $Cl_2$ as an etchant.

18. The method of claim 13, wherein said second silicon oxide gate layer is thermally grown, in a steam ambient, to a thickness between 100 to 110 Angstroms.

19. The method of claim 13, wherein said HTO layer is deposited to a thickness between about 90 to 110 Angstroms.

20. The method of claim 13, wherein said silicon nitride spacers are formed by deposition of a silicon nitride layer, at a thickness between about 160 to 200 Angstroms, followed by anisotropic etching, using $SF_6$ as an etchant.

21. The method of claim 13, wherein said second polysilicon layer is deposited using LPCVD procedures, to a thickness between about 1250 to 1750 Angstroms, and doped to a level between about 40 to 46 ohms/square using either LPCVD in situ doping procedures, or via use of either a phosphorous ion implantation, or a $POCl_3$ procedure.

22. The method of claim 13, wherein said metal silicide layer is tungsten silicide, deposited using LPCVD procedures, to a thickness between about 1000 to 1500 Angstroms.

23. The method of claim 13, wherein said control gate structure is formed via anisotropic RIE of said metal silicide layer, and of said second polysilicon layer, using $Cl_2$ as an etchant.

24. The method of claim 13, wherein said first conductivity imparting ion, used to create said deep, heavily doped, source side region, is phosphorous, ion implanted at an energy between about 50 to 70 KeV, at a dose between about 4E15 to 6E15 atoms/$cm^2$.

25. The method of claim 13, wherein said second conductivity imparting dopant, used to create said shallow, highly doped, source side region, is arsenic, ion implanted at an energy between 80 to 120 KeV, at a dose between about 4E15 to 6E15 atoms/$cm^2$.

26. The method of claim 13, wherein said insulator spacers are formed by deposition of a silicon oxide layer, via LPCVD or PECVD procedures, to a thickness between about 1500 to 2500 Angstroms, followed by an anisotropic RIE procedure, using $CHF_3$ as an etchant.

27. The method of claim 13, wherein said fourth conductivity imparting dopant, used to form said heavily doped drain region, is arsenic, ion implanted at an energy between about 50 to 70 KeV, at a dose between about 2E15 to 4E15 atoms/$cm^2$.

* * * * *